(12) United States Patent
Hanagata (10) Patent No.: US 11,923,443 B2
(45) Date of Patent: Mar. 5, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shoko Hanagata, Komatsu (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 218 days.

(21) Appl. No.: 17/469,239

(22) Filed: Sep. 8, 2021

(65) Prior Publication Data
US 2022/0302287 A1    Sep. 22, 2022

(30) Foreign Application Priority Data
Mar. 17, 2021   (JP) .................. 2021-043773

(51) Int. Cl.
*H01L 29/739* (2006.01)
*H01L 29/08* (2006.01)
*H01L 29/861* (2006.01)

(52) U.S. Cl.
CPC ........ *H01L 29/7397* (2013.01); *H01L 29/083* (2013.01); *H01L 29/861* (2013.01)

(58) Field of Classification Search
CPC ............. H01L 29/7397; H01L 29/861; H01L 29/0692; H01L 29/407; H01L 29/8613; H01L 29/0603; H01L 2924/12031; H01L 29/66325–66348; H01L 29/7393–7398; H01L 29/083–0839; H01L 29/868
See application file for complete search history.

(56) References Cited

U.S. PATENT DOCUMENTS

| | | | |
|---|---|---|---|
| 8,168,999 B2 | 5/2012 | Tsuzuki et al. | |
| 8,686,467 B2 | 4/2014 | Iwasaki et al. | |
| 9,761,582 B2 | 9/2017 | Gejo et al. | |
| 2020/0395215 A1* | 12/2020 | Kubouchi | ........... H01L 29/0619 |
| 2023/0039920 A1* | 2/2023 | Uchida | ................... H01L 29/36 |

FOREIGN PATENT DOCUMENTS

| | | | |
|---|---|---|---|
| JP | 5083468 B2 | 11/2012 | |
| JP | 5742711 B2 | 7/2015 | |
| JP | 6445952 B2 | 12/2018 | |
| JP | 2019-102773 A | 6/2019 | |
| JP | 2021077813 A | * | 5/2021 |

\* cited by examiner

*Primary Examiner* — Shahed Ahmed
(74) *Attorney, Agent, or Firm* — Allen & Overy LLP (57) ABSTRACT

A semiconductor device in which IGBT regions and diode regions are alternately set along a first direction, includes first to third electrodes, and a semiconductor portion. The semiconductor portion includes a collector layer, a low-concentration cathode layer, a high-concentration cathode layer, a drift layer, anode layers, base layers, and an emitter layer. The low-concentration cathode layer and the high-concentration cathode layer are in contact with the first electrode. When the diode region on a lower surface of the semiconductor portion is divided into three equal regions of a first peripheral region, a central region, and a second peripheral region along the first direction, an area ratio of the low-concentration cathode layer in the central region is higher than the area ratio of the low-concentration cathode layer in the first peripheral region and the second peripheral region.

10 Claims, 11 Drawing Sheets

SEMICONDUCTOR DEVICE

CROSS-REFERENCE TO RELATED APPLICATIONS

This application is based upon and claims the benefit of priority from Japanese Patent Application No. 2021-043773, filed on Mar. 17, 2021; the entire contents of which are incorporated herein by reference.

FIELD

Embodiments relate to a semiconductor device.

BACKGROUND

In recent years, there has been an increasing demand for power devices with low switching loss in industrial machines and automobiles. For example, reverse conducting IGBTs (RC-IGBTs) in which insulated gate bipolar transistors (IGBTs) and fast recovery diodes (FRDs) are configured on a single chip have been used. The RC-IGBTs are also required to further reduce switching loss. On the other hand, the RC-IGBTs are also required to have stability of operation.

DETAILED DESCRIPTION

A semiconductor device according to one embodiment is a semiconductor device in which a plurality of IGBT regions and a plurality of diode regions are alternately set along a first direction. The semiconductor device includes first to third electrodes, a semiconductor portion, and an insulating film. The semiconductor portion is provided on the first electrode, and includes a first conductivity type collector layer, a second conductivity type low-concentration cathode layer, a second conductivity type high-concentration cathode layer, a second conductivity type drift layer, a plurality of first conductivity type anode layers, a plurality of first conductivity type base layers, and a second conductivity type emitter layer. The collector layer is provided in the IGBT region and in contact with the first electrode. The low-concentration cathode layer and the high-concentration cathode layer are provided in the diode region and in contact with the first electrode. An impurity concentration is higher than an impurity concentration of the low-concentration cathode layer. The drift layer is provided on the collector layer, on the low-concentration cathode layer, and on the high-concentration cathode layer. The plurality of layers are partially provided on the drift layer in the diode region. The plurality of base layers are partially provided on the drift layer in the IGBT region. The emitter layer is provided on the base layer in the IGBT region. When the diode region on a lower surface of the semiconductor portion is divided into three equal regions of a first peripheral region, a central region, and a second peripheral region along the first direction, an area ratio of the low-concentration cathode layer in the central region is higher than the area ratio of the low-concentration cathode layer in the first peripheral region and the second peripheral region. The second electrode is provided on the semiconductor portion in the IGBT region and the diode region and is connected to the anode layer and the emitter layer. The third electrode is provided in the IGBT region and faces the emitter layer, the base layer, and the drift layer. The insulating film is provided between the semiconductor portion and the third electrode.

Hereinafter, embodiments will be described with reference to the drawings.

It is noted that the drawings are schematic, and the relationship between the thicknesses and widths of respective portions, the ratio of the sizes between the portions, and the like are not necessarily the same as the actual ones. In addition, even in a case where the same portions are represented, the dimensions and the ratios of the respective portions may be represented differently depending on the drawings. Furthermore, in the specification and the drawings, the same elements as those described with respect to the already described drawings are denoted by the same reference numerals, and detailed description of the elements will be omitted as appropriate.

First Embodiment

Figure 1:
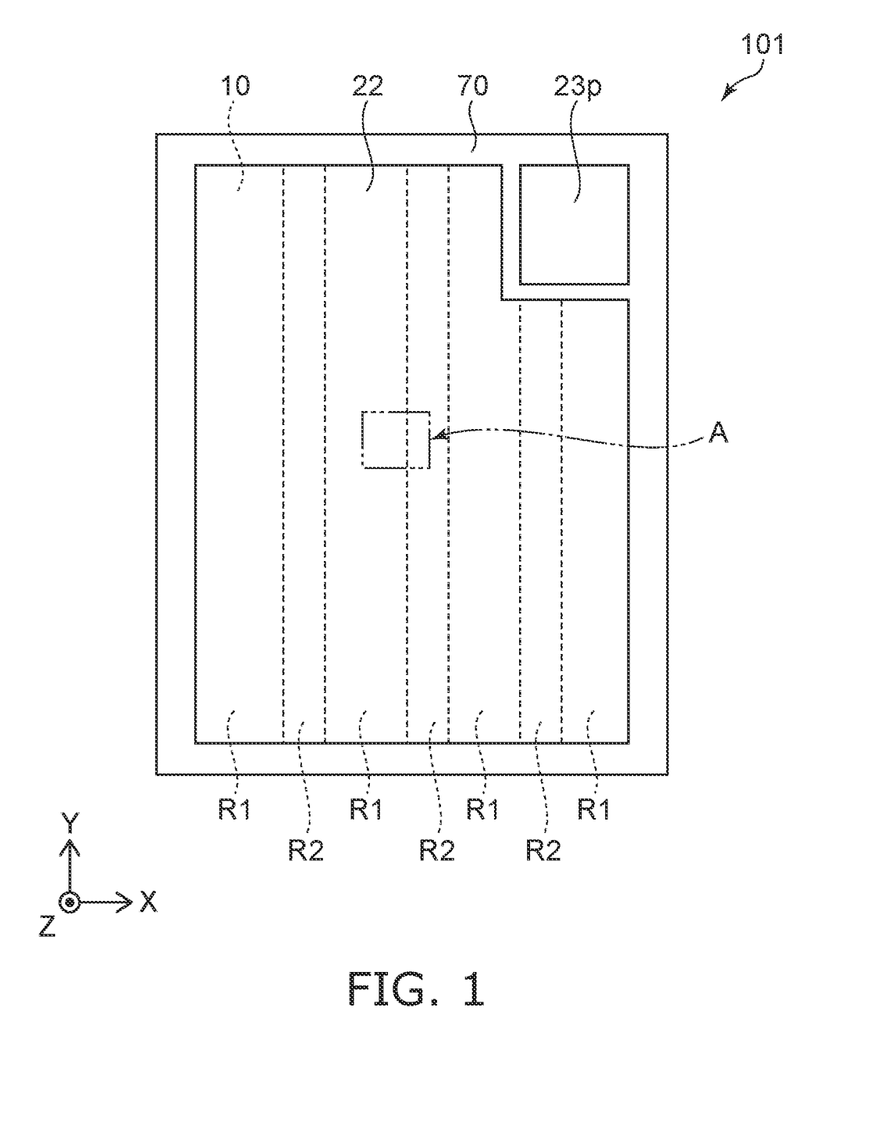
FIG. 1 is a plan view showing a semiconductor device according to a first embodiment.
Figure 2:
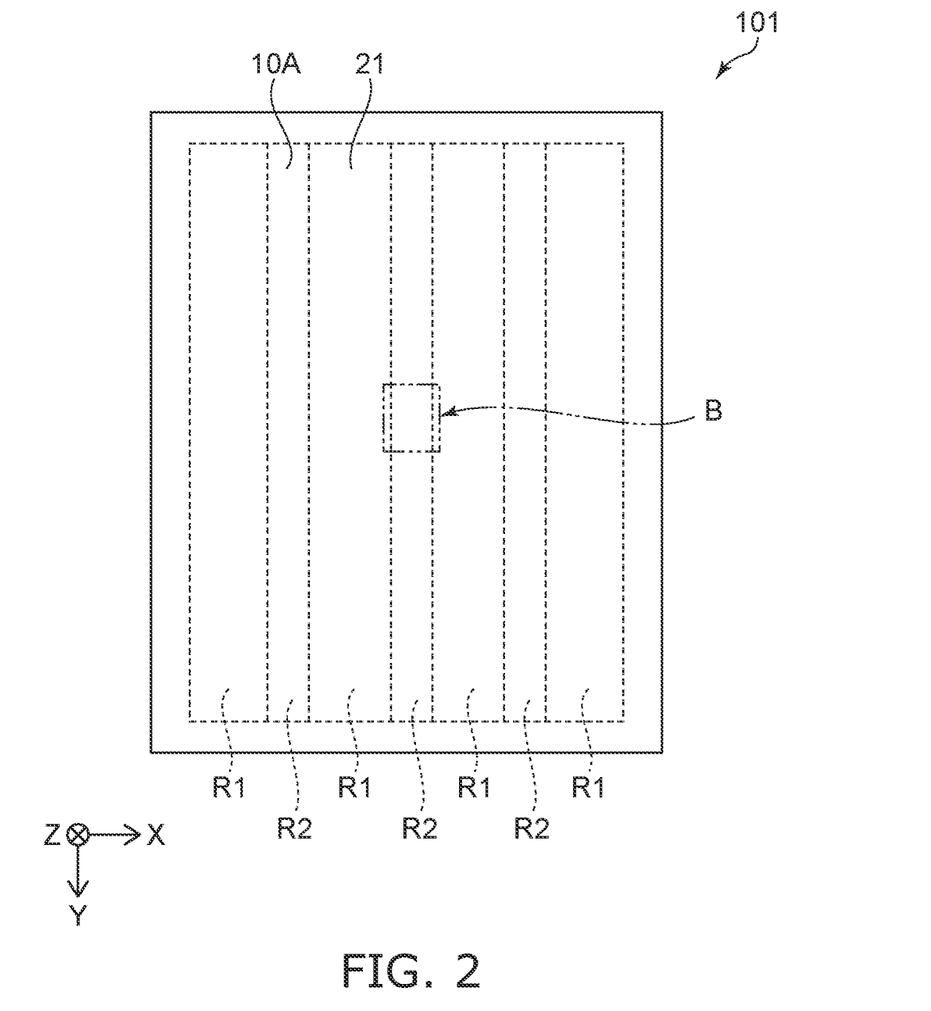
FIG. 2 is a bottom view showing the semiconductor device according to the first embodiment.
Figure 3:
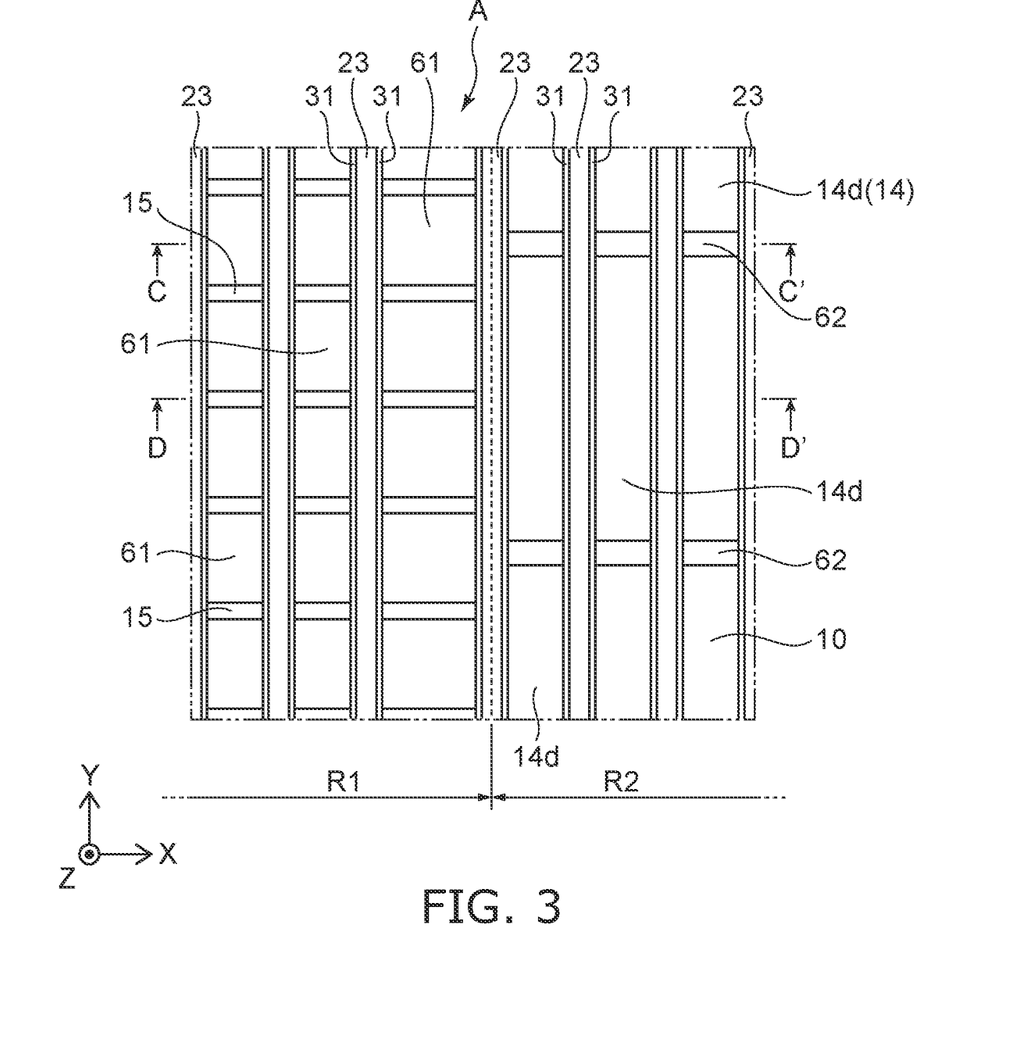
FIG. 3 is an enlarged plan view showing a region A of FIG. 1.
Figure 4A:
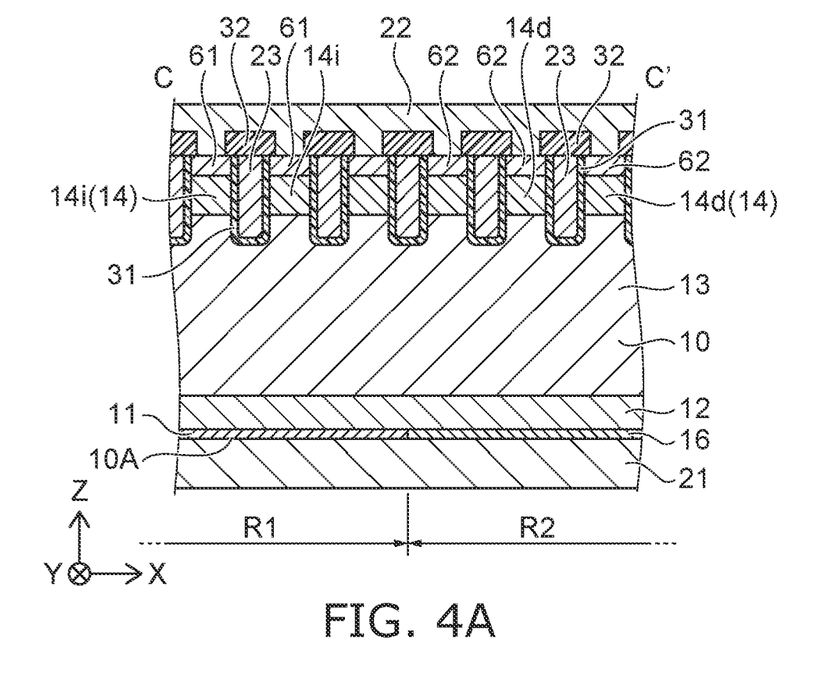
FIG. 4A is a partial cross-sectional view taken along line C-C' shown in FIG. 3.
Figure 4B:
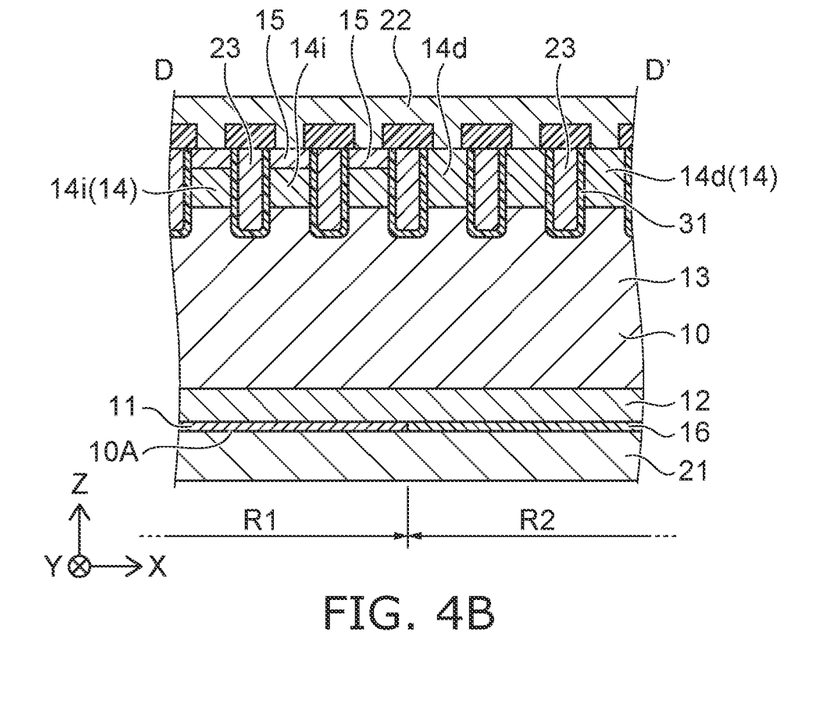
FIG. 4B is a partial cross-sectional view taken along line D-D' shown in FIG. 3.
Figure 5:
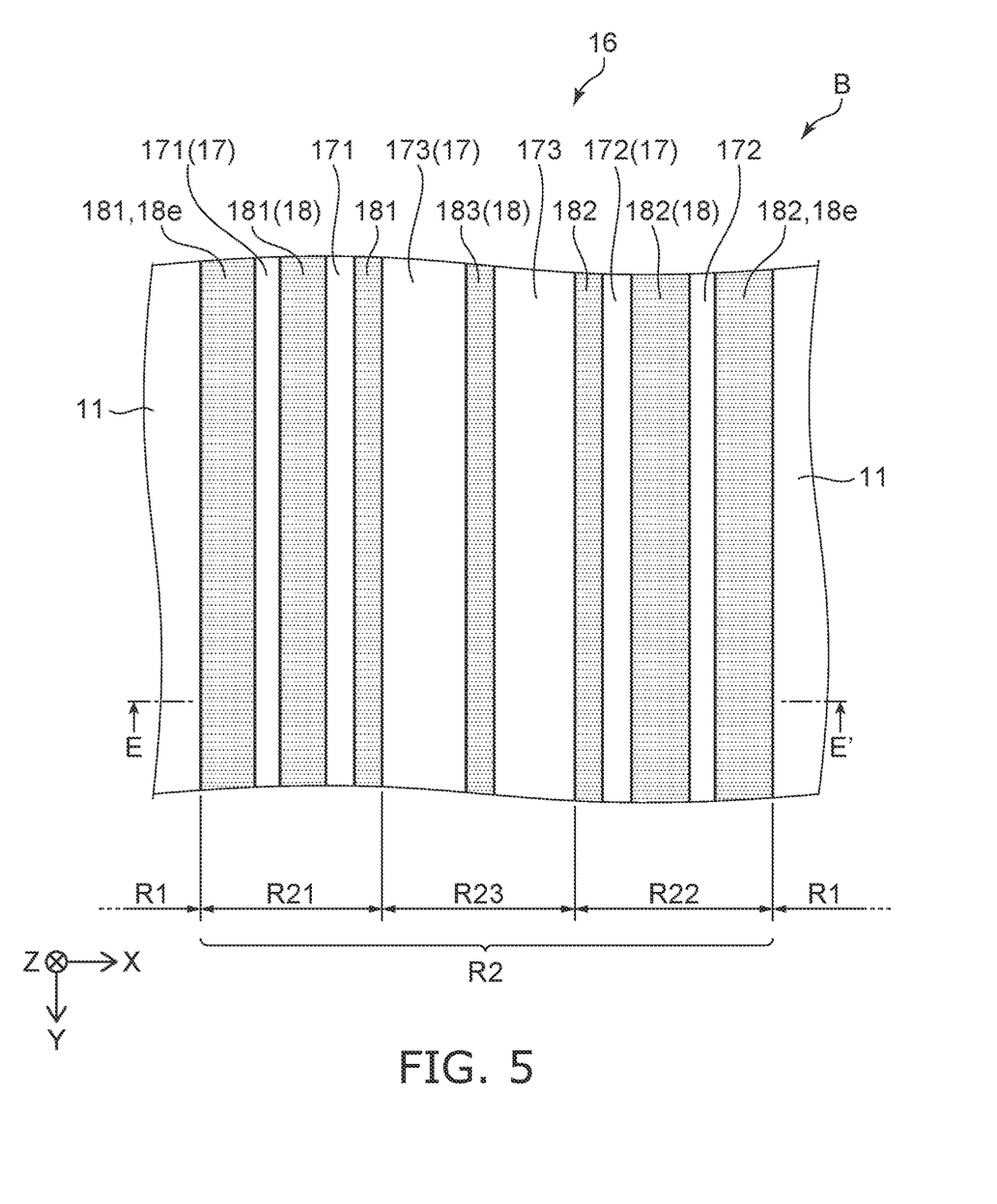
FIG. 5 is an enlarged bottom view showing a region B of FIG. 2.
Figure 6:
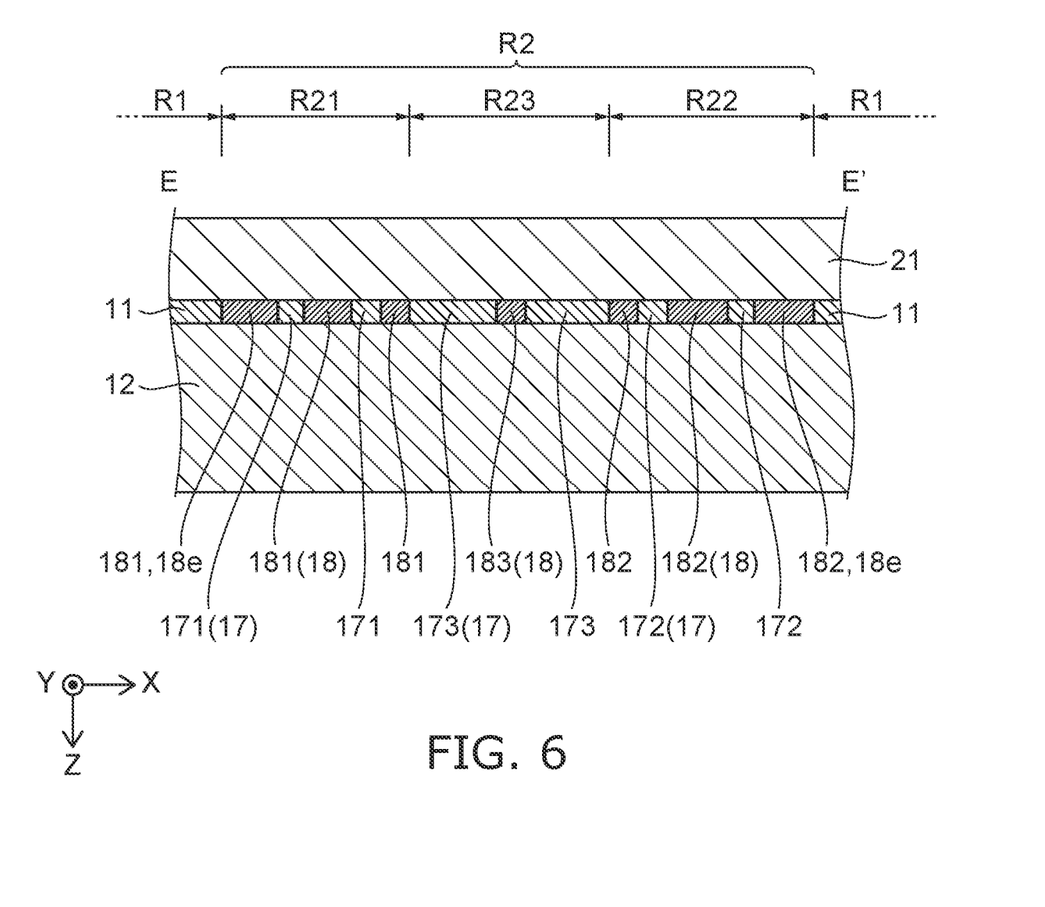
FIG. 6 is an enlarged cross-sectional view taken along line E-E' shown in FIG. 5.

FIG. 1 is a plan view showing a semiconductor device according to the embodiment. FIG. 2 is a bottom view showing the semiconductor device according to the embodiment. FIG. 3 is an enlarged plan view showing a region A of FIG. 1. FIG. 4A is a partial cross-sectional view taken along line C-C' shown in FIG. 3, and FIG. 4B is a partial cross-sectional view taken along line D-D' shown in FIG. 3. FIG. 5 is an enlarged bottom view showing the region B of FIG. 2. FIG. 6 is an enlarged cross-sectional view taken along line E-E' shown in FIG. 5.

In FIG. 1 and FIGS. 4A and 4B, a protective film and an interconnection layer are omitted. In FIG. 3, a second electrode 22 and an insulating film 32 described later are omitted. In FIG. 5, a first electrode 21 described later is omitted. From the viewpoint of visibility, in the drawings, stippling is added to the portion showing the surface of a high-concentration cathode layer 18 described later.

As shown in FIG. 1 and FIGS. 4A and 4B, a semiconductor device 101 according to the embodiment is an RC-IGBT in which multiple IGBT regions R1 and multiple diode regions R2 are alternately arranged. In the semiconductor device 101, the multiple IGBT regions R1 are set, and the diode regions R2 are set between the adjacent IGBT regions R1.

As shown in FIGS. 1 and 2, the IGBT region R1 and the diode region R2 extend along one direction, and a width, which is a length of the IGBT region R1 in a direction orthogonal to one direction of the IGBT region R1 is larger than the width of the diode region R2.

As shown in FIG. 1, the semiconductor device 101 is provided with the second electrode 22 and a gate pad 23p on the upper surface of the semiconductor device 101. A termination insulating film 70 is provided on the edge of the upper surface of the semiconductor device 101.

The second electrode 22 is, for example, an emitter electrode in the IGBT region R1, and the second electrode 22 is, for example, an anode electrode in the diode region R2.

As shown in FIG. 2, the semiconductor device 101 is provided with the first electrode 21 on the bottom surface. The first electrode 21 is provided on substantially the entire lower surface of the semiconductor device 101. The first electrode 21 is, for example, a collector electrode in the IGBT region R1, and the first electrode 21 is, for example, a cathode electrode in the diode region R2.

Herein, for the convenience of description, in the specification, as shown in FIG. 1, the arrangement direction of the IGBT region R1 and the diode region R2 is referred to as a "direction X", the direction which is orthogonal to the direction X and in which the IGBT region R1 and the diode region R2 extend is referred to as a "direction Y", and the direction which is orthogonal to the direction X and the direction Y is referred to as a "direction Z". The length in the direction X is also referred to as a "width".

In addition, the direction from the first electrode 21 toward the second electrode 22 is referred to as an "upward" direction, and the opposite direction is referred to as a "downward" direction, but these notations are also for the convenience and are independent of the direction of gravity. The upward direction is the direction Z.

As shown in FIG. 3 and FIGS. 4A and 4B, the semiconductor device 101 includes a semiconductor portion 10, a third electrode 23, a gate insulating film 31, and the insulating film 32 in addition to the first electrode 21, the second electrode 22, the gate pad 23p, and the termination insulating film 70.

As shown in FIGS. 4A and 4B, the semiconductor portion 10 is provided above the first electrode 21 and below the second electrode 22. The semiconductor portion 10 has a substantially rectangular parallelepiped shape and has an upper surface, a side surface, and a lower surface 10A. The semiconductor portion 10 includes a collector layer 11, a buffer layer 12, a drift layer 13, a p-type layer 14, an emitter layer 15, a cathode layer 16, a base contact 61, and an anode contact 62.

As shown in FIGS. 4A and 4B, the collector layer 11 is provided below the semiconductor portion 10 in the IGBT region R1. The lower surface of the collector layer 11 constitutes the lower surface 10A of the semiconductor portion 10 in the IGBT region R1 and is in contact with the first electrode 21. The collector layer 11 is made of a first conductivity type semiconductor, for example, a p-type semiconductor. The impurity concentration of the collector layer 11 is, for example, $1\times10^{17}$ cm$^{-3}$ or more and less than $1\times10^{20}$ cm$^{-3}$.

As shown in FIGS. 4A and 4B and FIG. 5, the cathode layer 16 is provided below the semiconductor portion 10 in the diode region R2. The lower surface of the cathode layer 16 constitutes the lower surface 10A of the semiconductor portion 10 in the diode region R2 and is in contact with the first electrode 21. The cathode layer 16 is made of a second conductivity type semiconductor, for example, an n-type semiconductor. As shown in FIG. 5, the cathode layer 16 includes multiple low-concentration cathode layers 17 and multiple high-concentration cathode layers 18. As described later, the concentration of the impurity to be a donor in the high-concentration cathode layer 18 is higher than the concentration of the impurity to be a donor in the low-concentration cathode layer 17.

As shown in FIGS. 4A and 4B, the buffer layer 12 is provided on the collector layer 11 and the cathode layer 16 and is in contact with the collector layer 11 and the cathode layer 16. The buffer layer 12 is made of a second conductivity type semiconductor, for example, an n-type semiconductor. The impurity concentration of the buffer layer 12 is, for example, equal to or less than the impurity concentration of the cathode layer 16. The impurity concentration of the buffer layer 12 is, for example, $1\times10^{16}$ cm$^{-3}$ or more and less than $1\times10^{17}$ cm$^{-3}$.

As shown in FIGS. 4A and 4B, the drift layer 13 is provided on the buffer layer 12. The upper portion of the drift layer 13 faces the lower portions of the multiple third electrodes 23 via the gate insulating film 31. The drift layer 13 is made of a second conductivity type semiconductor, for example, an n-type semiconductor. The impurity concentration of the drift layer 13 is lower than the impurity concentration of the buffer layer 12.

The third electrode 23 is, for example, a gate electrode. As shown in FIG. 3 and FIGS. 4A and 4B, the third electrode 23 is provided in a trench formed in the upper portion of the semiconductor portion 10 in the IGBT region R1 and the diode region R2. The multiple third electrodes 23 are provided so as to extend along the direction Y and are provided at substantially equal intervals along the direction X. The third electrode 23 is covered with the gate insulating film 31 except for the upper surface of the third electrode 23.

As shown in FIGS. 4A and 4B, the p-type layer 14 is provided between the two adjacent third electrodes 23 on the drift layer 13. The p-type layer 14 includes a base layer 14i provided in the IGBT region R1 and an anode layer 14d provided in the diode region R2.

As shown in FIGS. 4A and 4B, the third electrode 23 in the IGBT region R1 faces the drift layer 13, the base layer 14i, the emitter layer 15, and the base contact 61 via the gate insulating film 31. The third electrode 23 in the diode region R2 faces the drift layer 13, the anode layer 14d, and the anode contact 62 via the gate insulating film 31.

As shown in FIG. 3 and FIG. 4B, the anode layer 14d is partially disposed above the semiconductor portion 10, and specifically, the anode layer 14d is disposed above the semiconductor portion 10 between adjacent anode contacts 62 and is in contact with the second electrode 22.

The p-type layer 14 is made of a first conductivity type semiconductor, for example, a p-type semiconductor. The impurity concentration of the p-type layer 14 is, for example, $1\times10^{17}$ cm$^{-3}$ or more and less than $1\times10^{18}$ cm$^{-3}$.

As shown in FIG. 4B, the emitter layer 15 is partially provided on the base layer 14i in the IGBT region R1. The emitter layer 15 is provided on the upper portion of the semiconductor portion 10 and is in contact with the second electrode 22. As shown in FIG. 3, the multiple emitter layers 15 are provided so as to extend along the direction X and are provided at substantially equal intervals along the direction Y. The emitter layer 15 is made of a second conductivity type semiconductor, for example, an n-type semiconductor. The impurity concentration of the emitter layer 15 is, for example, $1\times10^{20}$ cm$^{-3}$ or more and less than $1\times10^{21}$ cm$^{-3}$.

As shown in FIG. 3 and FIG. 4A, multiple base contacts 61 are provided on the base layer 14i, for example, between the adjacent emitter layers 15. The base contact 61 is provided in the upper portion of the semiconductor portion 10 and is in contact with the second electrode 22. The base contact 61 is made of a first conductivity type semiconductor, for example, a p-type semiconductor.

As shown in FIG. 3 and FIG. 4A, the multiple anode contacts 62 are partially provided on the anode layer 14d. The anode contact 62 is provided in the upper portion of the semiconductor portion 10 and is in contact with the second electrode 22. As shown in FIG. 3, the multiple anode contacts are provided at substantially equal intervals along the direction X.

The anode contact 62 is made of a first conductivity type semiconductor, for example, a p-type semiconductor. The impurity concentrations of the anode contact 62 and the base contact 61 are, for example, $1 \times 10^{19}$ cm$^{-3}$ or more and less than $1 \times 10^{20}$ cm$^{-3}$.

In this manner, an IGBT is formed in the IGBT region R1 with the first electrode 21 being set as the collector, the second electrode 22 being set as the emitter, and the third electrode being set as the gate. In addition, a diode (FRD) is formed in the diode region R2 with the first electrode 21 being set as the cathode and the second electrode 22 being set as the anode. Accordingly, the semiconductor device 101 functions as an RC-IGBT.

Hereinafter, by setting one diode region R2 as an example, the low-concentration cathode layer 17 and the high-concentration cathode layer 18 will be described in detail.

As shown in FIG. 5 and FIG. 6, in one diode region R2, the multiple low-concentration cathode layers 17 and the multiple high-concentration cathode layers 18 are alternately arranged along the direction X. For example, the seven high-concentration cathode layers 18 are provided, and the high-concentration cathode layers 18 are arranged along the direction X. For example, the six low-concentration cathode layers 17 are provided, and the low-concentration cathode layers 17 are disposed between the adjacent high-concentration cathode layers 18.

As shown in FIG. 5, the length of each of the six low-concentration cathode layers 17 in the direction Y and the length of each of the seven high-concentration cathode layers 18 in the direction Y are substantially the same.

As shown in FIG. 6, the low-concentration cathode layer 17 and the high-concentration cathode layer 18 are provided between the first electrode 21 and the buffer layer 12.

The low-concentration cathode layer 17 and the high-concentration cathode layer 18 are made of a second conductivity type semiconductor, for example, an n-type semiconductor. The concentration of the impurity to be a donor of the high-concentration cathode layer 18 is higher than the concentration of the impurity to be a donor of the low-concentration cathode layer 17.

The concentration of the impurity to be a donor of the low-concentration cathode layer 17 is, for example, $1 \times 10^{16}$ cm$^{-3}$ or more and less than $1 \times 10^{17}$ cm$^{-3}$. The concentration of the impurity to be a donor of the high-concentration cathode layer 18 is, for example, $1 \times 10^{18}$ cm$^{-3}$ or more and less than $1 \times 10^{20}$ cm$^{-3}$. In addition, the impurity concentration of the low-concentration cathode layer 17 is, for example, substantially the same as the impurity concentration of the buffer layer 12.

As shown in FIG. 5 and FIG. 6, herein, the lower surface 10A of the semiconductor portion 10 in one diode region R2 provided between the adjacent IGBT regions R1 is divided into three equal regions along the direction X. The three divided regions are set as a first peripheral region R21, a central region R23, and a second peripheral region R22. Furthermore, for the convenience of description, in the diode region R2, the central side in the direction X is referred to as a "central side", and the end side in the direction X is referred to as an "end side".

As shown in FIG. 5 and FIG. 6, the three high-concentration cathode layers 18 (hereinafter, may be referred to as first high-concentration cathode layers 181) and the two low-concentration cathode layers 17 (hereinafter, may be referred to as first low-concentration cathode layers 171) are disposed in the first peripheral region R21.

The three high-concentration cathode layers 18 (hereinafter, may be referred to as second high-concentration cathode layers 182) and the two low-concentration cathode layers 17 (hereinafter, may be referred to as second low-concentration cathode layers 172) are disposed in the second peripheral region R22. The first high-concentration cathode layer 181 and the second high-concentration cathode layer 182 provided on the end side are edge high-concentration cathode layers 18e and are in contact with the collector layer 11.

The one high-concentration cathode layer 18 (hereinafter, may be referred to as a central high-concentration cathode layer 183) and the two low-concentration cathode layers 17 (hereinafter, may be referred to as central low-concentration cathode layers 173) are disposed in the central region R23. As shown in FIG. 5 and FIG. 6, the central high-concentration cathode layer 183 is disposed in the center of a diode region P2 in the direction X, and the two central low-concentration cathode layers 173 are disposed on the end sides of the central high-concentration cathode layer 183.

As shown in FIG. 5 and FIG. 6, the widths of the two central low-concentration cathode layers 173 are, for example, substantially the same. The width of the first low-concentration cathode layer 171 and the width of the second low-concentration cathode layer 172 are, for example, substantially the same. The width of the central low-concentration cathode layer 173 is smaller than the width of the first low-concentration cathode layer 171 and is smaller than the width of the second low-concentration cathode layer 172.

The widths of the two first high-concentration cathode layers 181 on the end side are, for example, substantially the same and are, for example, larger than the width of the first high-concentration cathode layer 181 on the central side. The widths of the two second high-concentration cathode layers 182 on the end side are, for example, substantially the same, and are, for example, larger than the width of the second high-concentration cathode layer 182 on the central side. The width of the edge high-concentration cathode layer 18e is, for example, smaller than the width of the central high-concentration cathode layer 183. As described above, the width of the high-concentration cathode layer 18 decreases from the end side toward the central side of the diode region R2.

The widths of the two first high-concentration cathode layers 181 on the end side and the widths of the two second high-concentration cathode layers 182 on the end side are, for example, 5 to 10 µm, and the width is, for example, about 2 to 3 times the width which is a length of the third electrode 23 in the direction X. The width of the central low-concentration cathode layer 173 is larger than, for example, the width of the edge high-concentration cathode layer 18e.

From the relationship between the width and the length of the low-concentration cathode layer 17 and the high-concentration cathode layer 18 in the direction Y as described above, the area ratios occupied by the low-concentration cathode layer 17 and the high-concentration cathode layer 18 in the first peripheral region R21, the second peripheral region R22, and the central region R23 are as follows, respectively.

As shown in FIG. 5, the area ratio occupied by the low-concentration cathode layer 173 in the central region R23 is higher than the area ratio occupied by the low-concentration cathode layer 171 in the first peripheral region R21 and higher than the area ratio occupied by the low-concentration cathode layer 172 in the second peripheral region R22. The area ratio occupied by the low-concentration cathode layer 171 in the first peripheral region R21 is, for example, substantially the same as the area ratio occupied by the low-concentration cathode layer 172 in the second peripheral region R22.

The area ratio occupied by the high-concentration cathode layer 183 in the central region R23 is lower than the area ratio occupied by the high-concentration cathode layer 181 in the first peripheral region R21 and lower than the area ratio occupied by the high-concentration cathode layer 182 in the second peripheral region R22. The area ratio occupied by the high-concentration cathode layer 181 in the first peripheral region R21 is, for example, substantially the same as the area ratio occupied by the high-concentration cathode layer 182 in the second peripheral region R22.

In the first peripheral region R21, the area ratio of the high-concentration cathode layer 181 is higher than the area ratio of the low-concentration cathode layer 171. In the second peripheral region R22, the area ratio of the high-concentration cathode layer 182 is higher than the area ratio of the low-concentration cathode layer 172. In the central region R23, the area ratio occupied by the low-concentration cathode layer 173 is higher than the area ratio occupied by the high-concentration cathode layer 183.

Hereinafter, the operations of the semiconductor device 101 according to the embodiment will be described.

The semiconductor device 101 is connected, for example, between a power supply device and a load such as a motor. When the power supply device applies a voltage to the semiconductor device 101 so that the first electrode 21 is the positive electrode and the second electrode 22 is the negative electrode, if a potential equal to or higher than the threshold value is applied to the third electrode 23, the IGBT formed in the IGBT region R1 is turned on, and thus, holes are injected from the first electrode 21 and electrons are injected from the second electrode 22, so that a collector current flows from the first electrode 21 to the second electrode 22.

When the potential of the third electrode 23 becomes less than the threshold value, the IGBT is turned off, and the collector current is stopped. At this time, due to the load connected to the semiconductor device 101, a voltage is applied such that the second electrode 22 is set as the positive electrode and the first electrode 21 is set as the negative electrode. Accordingly, in the IGBT region R1, holes are discharged through the collector layer 11, and electrons are discharged through the emitter layer 15.

On the other hand, in the diode region R2, since a forward voltage is applied to the diode, a reflux current flows from the second electrode 22 to the first electrode 21. At this time, holes flow in from the second electrode 22 through the anode layer 14d, electrons flow in from the first electrode 21 through the cathode layer 16, and a conductivity of the drift layer 13 increases. As a result, the reflux current increases.

In this case, as the impurity concentration of the cathode layer 16 in the diode region R2 is increased, the number of electrons flowing in through the cathode layer 16 is increased. As a result, the effect of the conductivity modulation becomes large in the diode region R2, and thus, the electric resistance of the drift layer 13 is decreased, so that the reflux current is increased. On the other hand, as the impurity concentration of the cathode layer 16 is decreased, the inflow amount of electrons is reduced, and thus, the effect of the conductivity modulation becomes small, so that the electrical resistance of the drift layer 13 is increased. As a result, the reflux current is reduced.

In order to reduce the switching loss of the semiconductor device 101, it is effective to reduce the reflux current, and for this reason, it is favorable to reduce the impurity concentration of the cathode layer 16. However, when the impurity concentration of the cathode layer 16 is reduced, the snapback is likely to occur, and the operation of the semiconductor device 101 becomes unstable. In particular, in the vicinity of the IGBT region R1 in the diode region R2, since some of the holes existing in the drift layer 13 of the diode region R2 are discharged from the collector layer 11 of the IGBT region R1, the number of holes injected from the drift layer 13 into the cathode layer 16 is reduced, and thus, the number of electrons injected from the cathode layer 16 into the drift layer 13 is further reduced. For this reason, the snapback is more likely to occur in the vicinity of the IGBT region R1 in the diode region R2.

For this reason, in the embodiment, in order to achieve both the reduction of reflux current and the suppression of the snapback, the low-concentration cathode layer 17 and the high-concentration cathode layer 18 are provided on the cathode layer 16, the area ratio is allowed to be different depending on the position in the diode region R2. In the semiconductor device 101, since the area ratio of the low-concentration cathode layer 17 in the central region R23 is high, the injection amount of carriers is reduced, and thus, the switching loss during the reverse recovery operation is low.

On the other hand, in the first peripheral region R21 and the second peripheral region R22, since the area ratio of the high-concentration cathode layer 18 is high, the injection amount of carriers increases, and in the buffer layer 12 and drift layer 13 in the region immediately above the first peripheral region R21 and the second peripheral region R22, the effect of the conductivity modulation becomes large, and the resistance value is decreased. Accordingly, since the outflow of carriers from the buffer layer 12 and the drift layer 13 in the region immediately above the first peripheral region R21 and the second peripheral region R22 to the buffer layer 12 and the drift layer 13 in the adjacent IGBT region R1 is suppressed, the reduction of the amount of holes discharged from the cathode layer 16 in the first peripheral region R21 and the second peripheral region R22 is suppressed. Since the injection amount of electrons increases or decreases according to the amount of holes discharged from the cathode layer 16, the electrons are effectively injected into the cathode layer 16 in the first peripheral region R21 and the second peripheral region R22. As described above, in the portion of the buffer layer 12 and the drift layer 13 adjacent to the IGBT region R1, since the effect of the conductivity modulation becomes good, the snapback is suppressed.

In addition, since the resistance values of the buffer layer 12 and the drift layer 13 in the region immediately above the first peripheral region R21 and the second peripheral region R22 are low, the holes also flow in from the buffer layer 12 and the drift layer 13 in the central region R23, and thus, the amount of holes is further increased, so that the occurrence of the snapback is effectively suppressed. Accordingly, the operation of the semiconductor device 101 is stabilized.

Hereinafter, a method for manufacturing the semiconductor device 101 according to the embodiment will be described.

For example, the semiconductor portion 10 made of an n⁻-type semiconductor is prepared, and the buffer layer 12 is formed by ion-implanting n-type impurities from, for example, the lower surface 10A side of the semiconductor portion 10 into a portion where the buffer layer 12 is to be formed.

Next, the collector layer 11 is formed by ion-implanting p-type impurities from the lower surface 10A side of the semiconductor portion 10 into the portion where the collector layer 11 is to be formed by using, for example, lithography.

Next, the high-concentration cathode layer 18 is formed by ion-implanting n-type impurities from the lower surface 10A side of the semiconductor portion 10 into the portion where the high-concentration cathode layer 18 is to be formed by using, for example, lithography. The portion of the cathode layer 16 where the high-concentration cathode layer 18 is not formed is the low-concentration cathode layer 17.

Hereinafter, the effects of the semiconductor device 101 according to the embodiment will be described.

According to the semiconductor device 101 according to the embodiment, the cathode layer 16 has the low-concentration cathode layer 17 and the high-concentration cathode layer 18, and thus, the area ratio of the low-concentration cathode layer in the first peripheral region R21 and the second peripheral region R22 adjacent to the IGBT region R1 is allowed to be lower than the area ratio of the low-concentration cathode layer in the central region R23. As a result, the semiconductor device 101 can reduce the switching loss during the reverse recovery operation and suppress the occurrence of the snapback.

When the structure of the semiconductor device 101 according to the embodiment is not used, for example, in order to reduce the switching loss during the reverse recovery operation, a method for reducing the current during the reverse recovery operation by suppressing the injection amount of the carrier entering from the cathode side is considered. Specifically, for example, reducing the impurity concentration of the cathode layer is considered. In this case, since the injection amount of carriers is low when the diode is in a conducting state, the number of carriers in the buffer layer and the drift layer is decreased, and the effect of the conductivity modulation becomes small. Accordingly, the resistance values of the buffer layer and the drift layer in the diode region become approximate to the resistance values of the buffer layer and the drift layer in the IGBT region, and the holes intrude into the IGBT region R1, so that the amount of holes discharged from the cathode layer is reduced. Accordingly, since the amount of electrons injected into the cathode layer is reduced, the carrier density is lowered in the diode region, and thus, the snapback is likely to occur.

In addition, as another method, for example, there is a method for controlling the lifetime by irradiating the semiconductor portion 10 of the diode region with an electron beam. However, in this case, the semiconductor portion 10 of the adjacent IGBT region R1 is also irradiated with the electron beam, and thus, the characteristics of the IGBT may deteriorate.

On the other hand, according to the embodiment, the injection amount of the carrier can be reduced without controlling the lifetime and suppressing the snapback, and the loss can be reduced.

In addition, in the embodiment, the low-concentration cathode layer 17 and the high-concentration cathode layer 18 are arranged symmetrically in the diode region R2, but the invention is not limited thereto, and the low-concentration cathode layer 17 and the high-concentration cathode layer 18 may be arranged asymmetrically.

In addition, the number and width of the low-concentration cathode layers 17 and the high-concentration cathode layers 18 in one diode region R2 are not limited to those described above. For example, it is favorable that the number of the low-concentration cathode layers 17 and the high-concentration cathode layers 18 is equal to or larger than the number in the embodiment so that the carrier density does not change suddenly.

In addition, the central high-concentration cathode layer 183 is arranged in the center of the diode region P2 in the direction X, but the invention is not limited thereto, and the high-concentration cathode layer 18 and the low-concentration cathode layer 17 may be arranged, so that for example, the central low-concentration cathode layer 173 is arranged in the center of the diode region R2 in the direction X.

First Variation of First Embodiment

Figure 7:
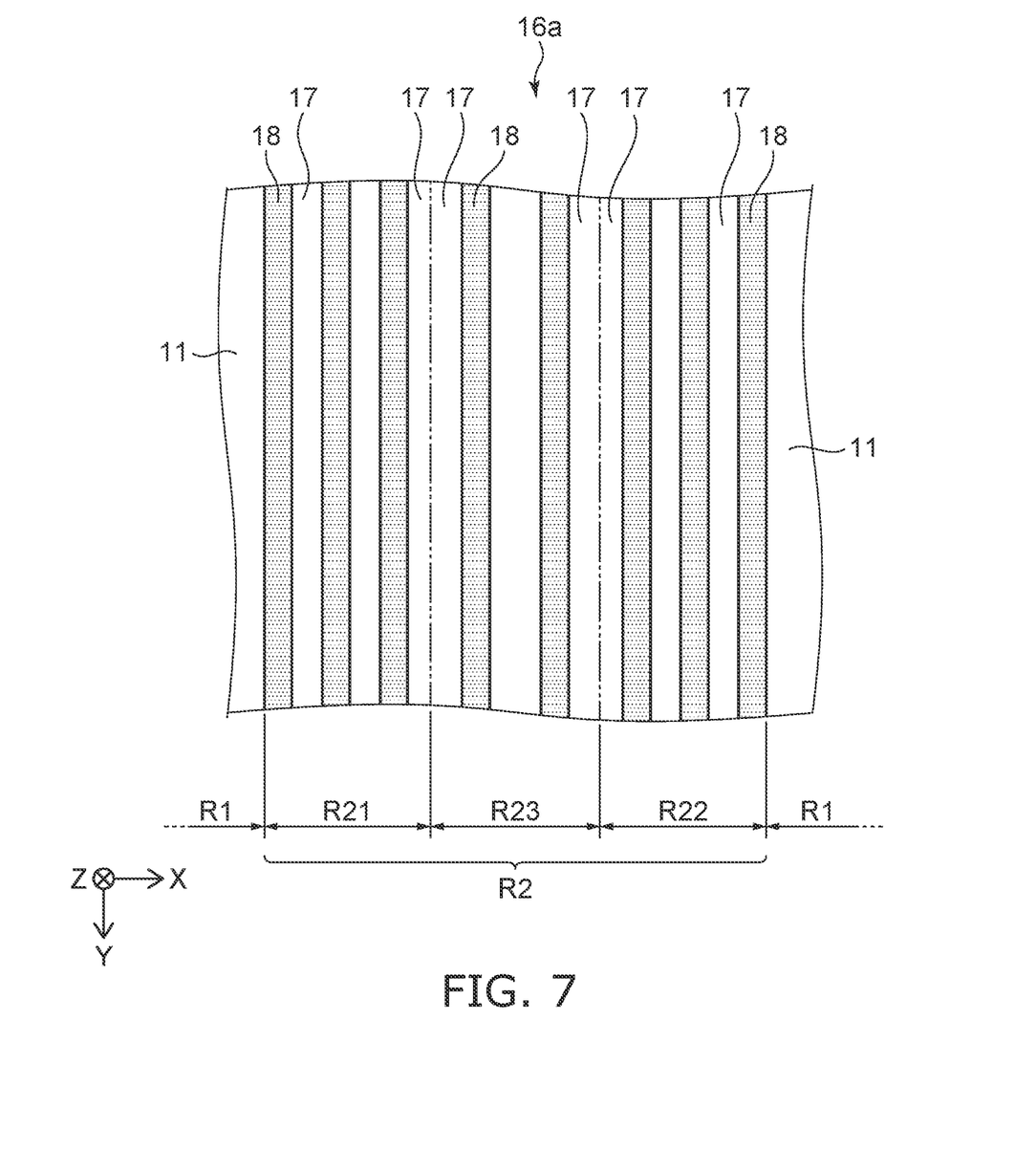
FIG. 7 is an enlarged bottom view showing a cathode layer in a first variation of the first embodiment.

A cathode layer 16a in the variation has the multiple high-concentration cathode layers 18 having substantially the same width and different arrangement density in the direction X.

FIG. 7 is an enlarged bottom view showing the cathode layer in the variation. In FIG. 7, the first electrode 21 is omitted.

The arrangement density of the high-concentration cathode layer 18 in the first peripheral region R21 and the second peripheral region R22 is higher than the arrangement density of the high-concentration cathode layer 18 in the central region R23. Accordingly, the area occupancy ratio of the high-concentration cathode layer 18 is higher than that of the central region R23 in the first peripheral region R21 and the second peripheral region R22, and the area occupancy ratio of the low-concentration cathode layer 17 is lower than that of the central region R23 in the first peripheral region R21 and the second peripheral region R22.

The configurations, operations, and effects other than the above in the embodiment are the same as those in the first embodiment.

Second Variation of First Embodiment

Figure 8:
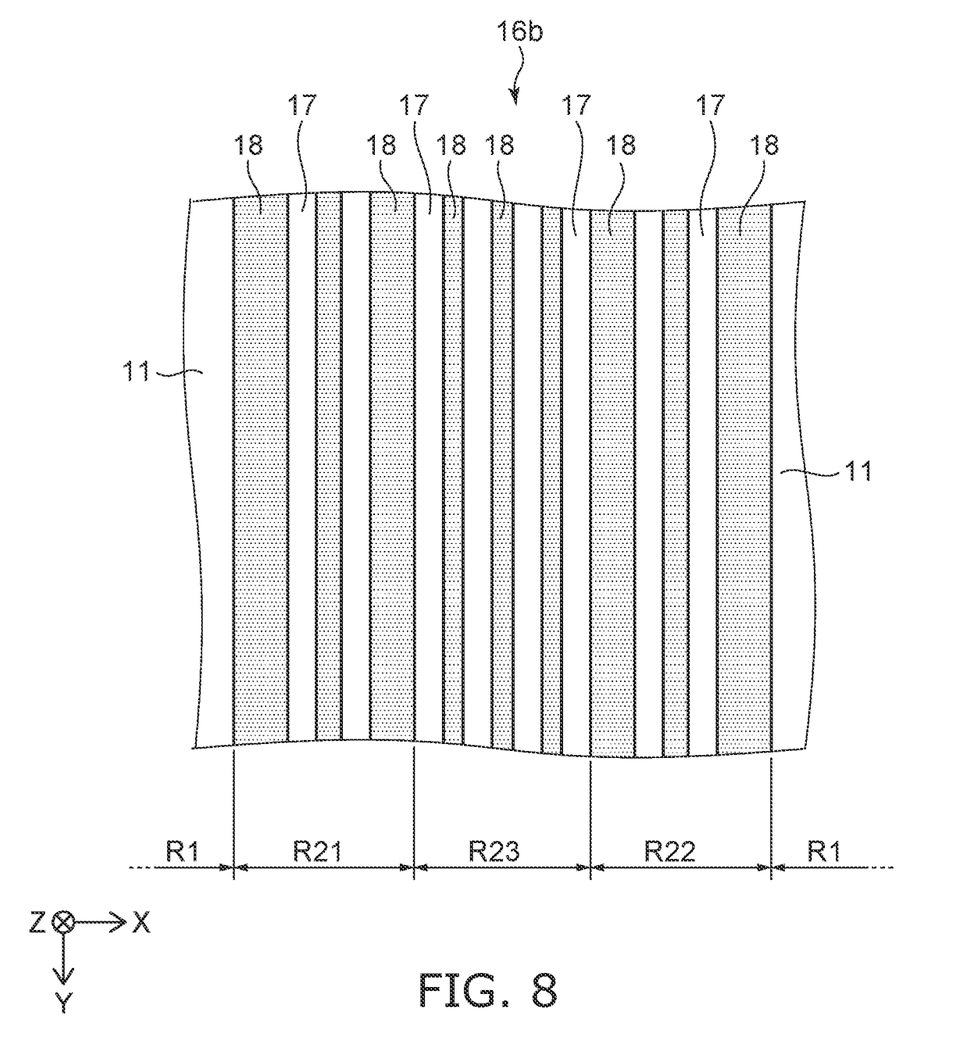
FIG. 8 is an enlarged bottom view showing a cathode layer in a second variation of the first embodiment.

A cathode layer 16b in the variation has the multiple low-concentration cathode layers 17 having substantially the same width but different arrangement density in the direction X.

FIG. 8 is an enlarged bottom view showing the cathode layer in the variation. In FIG. 8, the first electrode 21 is omitted.

The arrangement density of the low-concentration cathode layer 17 in the first peripheral region R21 and the second peripheral region R22 is lower than the arrangement density of the low-concentration cathode layer 17 in the central region R23. Accordingly, the area occupancy ratio of the low-concentration cathode layer 17 is lower than that of the central region R23 in the first peripheral region R21 and the second peripheral region R22, and the area occupancy ratio of the high-concentration cathode layer 18 is higher than that of the central region R23 in the first peripheral region R21 and the second peripheral region R22.

The configurations, operations, and effects other than the above in the embodiment are the same as those in the first embodiment.

Third Variation of First Embodiment

Figure 9:
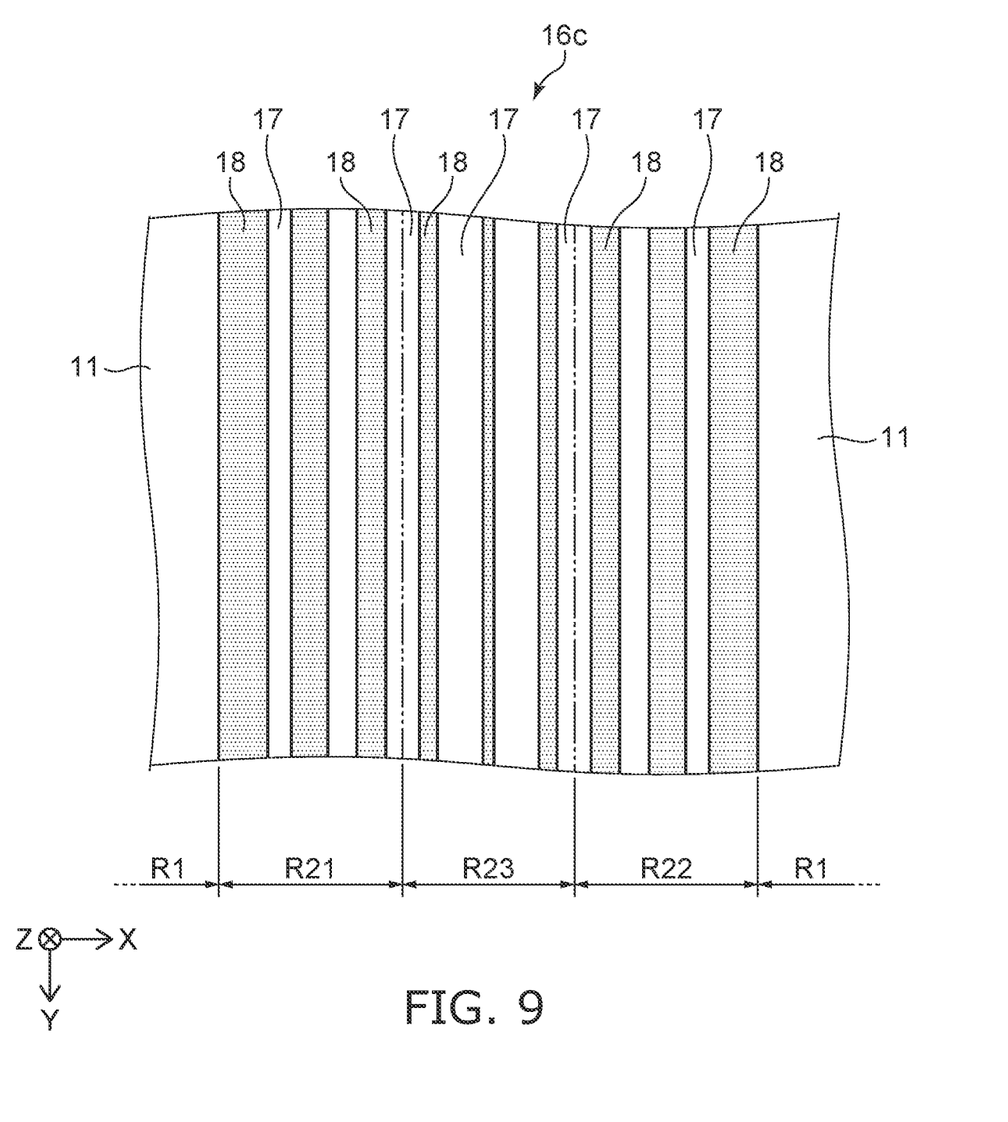
FIG. 9 is an enlarged bottom view showing a cathode layer in a third variation of the first embodiment.

In a cathode layer 16c in the variation, the widths of the high-concentration cathode layer 18 and the low-concentration cathode layer 17 continuously change.

FIG. 9 is an enlarged bottom view showing the cathode layer in the variation. In FIG. 9, the first electrode 21 is omitted.

The width of the high-concentration cathode layer 18 decreases from the end side toward the central side, and the width of the low-concentration cathode layer 17 increases from the end side toward the central side. Accordingly, the area occupancy ratio of the high-concentration cathode layer 18 is higher than that of the central region R23 in the first peripheral region R21 and the second peripheral region R22, and the area occupancy ratio of the low-concentration cathode layer 17 is lower than that of the central region R23 in the first peripheral region R21 and the second peripheral region R22.

The configurations, operations, and effects other than the above in the embodiment are the same as those in the first embodiment.

Second Embodiment

Figure 10:
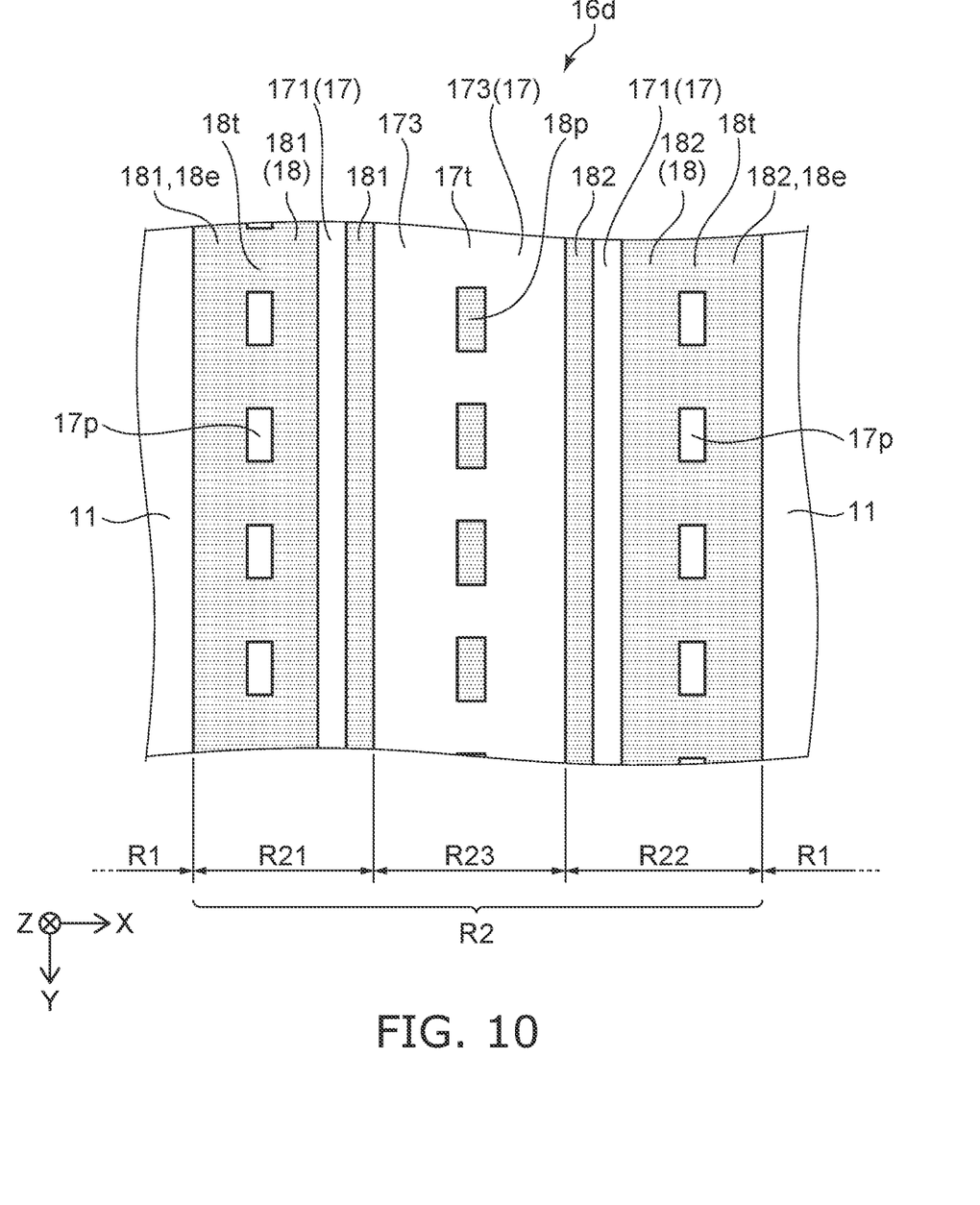
FIG. 10 is an enlarged bottom view showing a cathode layer in a second embodiment.

A cathode layer 16d in the embodiment further has multiple partial low-concentration cathode layers 17p separately provided in the direction Y, side portions 17t partially extending from the low-concentration cathode layer 17 toward the central side or the end side, multiple partial high-concentration cathode layers 18p separately provided in the direction Y, and side portions 18t partially extending from the high-concentration cathode layer 18 toward the central side or the end side.

FIG. 10 is an enlarged bottom view showing the cathode layer in the embodiment. In FIG. 10, the first electrode 21 is omitted.

In the first peripheral region R21 in the embodiment, the two first high-concentration cathode layers 181, the multiple side portions 18t extending from the edge high-concentration cathode layer 18e toward the central side, the one first low-concentration cathode layer 171, and the multiple partial low-concentration cathode layers 17p are provided.

In the second peripheral region R22, the two second high-concentration cathode layers 182, the multiple side portions 18t extending from the edge high-concentration cathode layer 18e toward the central side, the one second low-concentration cathode layer 172, and the multiple partial low-concentration cathode layers 17p are provided. The partial low-concentration cathode layer 17p is the low-concentration cathode layer 17 arranged on the most edge side of the diode region R2.

As shown in FIG. 7, in the first peripheral region R21 and the second peripheral region R22, since the side portion 18t and the partial low-concentration cathode layer 17p are provided, the area ratio of the high-concentration cathode layer 18 is much higher than the area ratio of the low-concentration cathode layer 17.

In the central region R23, the two central low-concentration cathode layers 173, the multiple side portions 17t extending from the central low-concentration cathode layer 173 toward the central side, and the multiple partial high-concentration cathode layers 18p are provided. The multiple side portions 17t and the multiple partial high-concentration cathode layers 18p in the central region R23 are provided in the center of the diode region R2 in the direction X.

As shown in FIG. 7, in the central region R23, since the side portion 17t and the partial high-concentration cathode layer 18p are provided, the area ratio of the low-concentration cathode layer 17 is much higher than the area ratio of the high-concentration cathode layer 18.

According to the embodiment, due to the partial low-concentration cathode layer 17p, the partial high-concentration cathode layer 18p, and the side portions 17t and 18t, the impurity concentration of the cathode layer 16 can be easily adjusted. In addition, according to the lithography and ion implantation in the first embodiment, complicated patterning of the low-concentration cathode layer 17 and the high-concentration cathode layer 18 as in the embodiment can be achieved.

According to the embodiment, similarly to the first embodiment, the switching loss during the reverse recovery operation can be reduced, and the occurrence of the snap-back can be suppressed.

In addition, the shape of the low-concentration cathode layer 17 and the high-concentration cathode layer 18 on the lower surface 10A of the semiconductor portion 10 is a shape formed by combining rectangular shapes, but the invention is not limited thereto, a circular shape or a shape similar to the circular shape, a polygonal shape other than a quadrangle such as a triangle, or a shape formed by combining these shapes may be used.

The configurations, operations, and effects other than the above in the embodiment are the same as those in the first embodiment.

Variation of Second Embodiment

Figure 11:
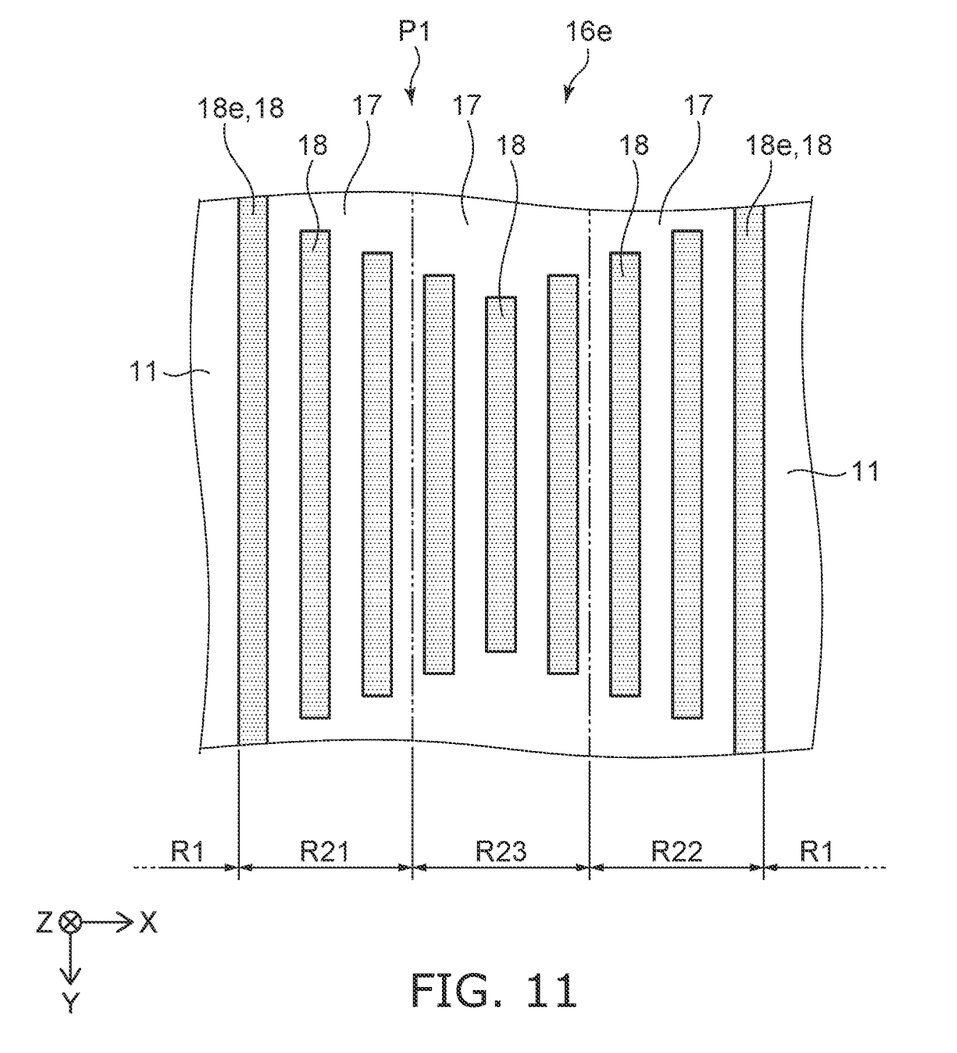
FIG. 11 is an enlarged bottom view showing an arrangement pattern of a cathode layer in a variation of the second embodiment.

A cathode layer 16e in the variation has multiple arrangement patterns P1 formed along the direction Y.

FIG. 11 is an enlarged bottom view showing the arrangement pattern of the cathode layer in the variation. In FIG. 11, the first electrode 21 is omitted.

The arrangement patterns P1 includes, for example, the multiple high-concentration cathode layers 18 having substantially the same width and having substantially uniform arrangement density in the direction X and the low-concentration cathode layers 17 provided between the multiple high-concentration cathode layers 18. The edge high-concentration cathode layer 18e extends, for example, along the direction Y and is continuous, for example, with the edge high-concentration cathode layer 18e of the adjacent arrangement patterns P1. The length of the high-concentration cathode layer 18 other than the edge high-concentration cathode layer 18e in the direction Y is decreased from the end side toward the central side.

Accordingly, the area occupancy ratio of the high-concentration cathode layer 18 is higher than that of the central region R23 in the first peripheral region R21 and the second peripheral region R22, and the area occupancy ratio of the low-concentration cathode layer 17 is lower than that of the central region R23 in the first peripheral region R21 and the second peripheral region R22.

The configurations, operations, and effects other than the above in the embodiment are the same as those in the first embodiment.

According to the embodiment of the invention, it is possible to provide a semiconductor device capable of reducing loss and obtaining stable operations.

Heretofore, the embodiments of the invention have been described above with reference to specific examples. However, the embodiments of the invention are not limited to these specific examples. For example, specific configurations, materials, and the like of the semiconductor portions, the first electrode, the second electrode, and the third electrode included in the semiconductor device are included in the scope of the invention as long as the invention is similarly carried out by appropriately selecting from a range known to those skilled in the art and the same effect can be obtained. A combination of any two or more elements of the specific example to the technically possible extent is also included in the scope of the invention as long as the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device in which a plurality of IGBT regions and a plurality of diode regions are alternately set along a first direction, the semiconductor device comprising:
    a first electrode;
    a semiconductor portion provided on the first electrode, the semiconductor portion including:
        a first conductivity type collector layer provided in the IGBT region and in contact with the first electrode;
        a second conductivity type low-concentration cathode layer provided in the diode region and in contact with the first electrode;
        a high-concentration cathode layer provided in the diode region, in contact with the first electrode, being of a second conductivity type, and having an impurity concentration higher than an impurity concentration of the low-concentration cathode layer;
        a second conductivity type drift layer provided on the collector layer, on the low-concentration cathode layer, and on the high-concentration cathode layer;
        a plurality of first conductivity type anode layers partially provided on the drift layer in the diode region;
        a plurality of first conductivity type base layers partially provided on the drift layer in the IGBT region; and
        a second conductivity type emitter layer provided on the base layer in the IGBT region,
        when the diode region on a lower surface of the semiconductor portion is divided into three equal regions of a first peripheral region, a central region, and a second peripheral region along the first direction, an area ratio of the low-concentration cathode layer in the central region being higher than the area ratio of the low-concentration cathode layer in the first peripheral region and the second peripheral region;
    a second electrode provided on the semiconductor portion in the IGBT region and the diode region and connected to the anode layer and the emitter layer;
    a third electrode provided in the IGBT region and facing the emitter layer, the base layer, and the drift layer; and
    an insulating film provided between the semiconductor portion and the third electrode.

2. The device according to claim 1, wherein, in the lower surface of the semiconductor portion in the diode region, the plurality of high-concentration cathode layers are arranged to be spaced from each other along the first direction, and the low-concentration cathode layer is interposed in a gap.

3. The device according to claim 2, wherein the plurality of low-concentration cathode layers and the plurality of high-concentration cathode layers extend in a second direction intersecting the first direction.

4. The device according to claim 1, wherein a length of the low-concentration cathode layer in the central region in the first direction is larger than the length of the low-concentration cathode layer in the first peripheral region in the first direction.

5. The device according to claim 1, wherein a length of the high-concentration cathode layer in the first peripheral region in the first direction is larger than the length of the high-concentration cathode layer in the central region in the first direction.

6. The device according to claim 1, wherein the high-concentration cathode layer arranged on an end side of the first peripheral region in the first direction is an edge high-concentration cathode layer in contact with the collector layer.

7. The device according to claim 6, wherein a length of the low-concentration cathode layer in the central region in the first direction is larger than the length of the edge high-concentration cathode layer in the first direction.

8. The device according to claim 1,
    wherein the semiconductor portion further includes a second conductivity type buffer layer provided between the collector layer, the low-concentration cathode layer, the high-concentration cathode layer, and the drift layer, and
    an impurity concentration of the buffer layer is higher than an impurity concentration of the drift layer.

9. The device according to claim 1,
    wherein the high-concentration cathode layer has a plurality of partial high-concentration cathode layers spaced in a direction intersecting the first direction, and
    a portion of the low-concentration cathode layer is provided between the adjacent partial high-concentration cathode layers.

10. The device according to claim 1,
    wherein the low-concentration cathode layer has a plurality of partial low-concentration cathode layers spaced in a direction intersecting the first direction, and
    a portion of the high-concentration cathode layer is provided between the adjacent partial low-concentration cathode layers.

* * * * *